(12) United States Patent
Deboy et al.

(10) Patent No.: US 6,914,297 B2
(45) Date of Patent: Jul. 5, 2005

(54) CONFIGURATION FOR GENERATING A VOLTAGE SENSE SIGNAL IN A POWER SEMICONDUCTOR COMPONENT

(75) Inventors: Gerald Deboy, München (DE); Armin Willmeroth, Augsburg (DE)

(73) Assignee: Infineon Technologies AG, Munich (DE)

( * ) Notice: Subject to any disclaimer, the term of this patent is extended or adjusted under 35 U.S.C. 154(b) by 143 days.

(21) Appl. No.: 10/629,107

(22) Filed: Jul. 29, 2003

(65) Prior Publication Data

US 2005/0024925 A1 Feb. 3, 2005

(30) Foreign Application Priority Data

Jul. 29, 2002 (DE) .......................................... 102 34 493

(51) Int. Cl.[7] .............................................. H01L 29/76
(52) U.S. Cl. ........................ 257/341; 257/343; 257/379; 257/532
(58) Field of Search ................................. 257/341, 343, 257/360, 379, 532

(56) References Cited

U.S. PATENT DOCUMENTS

| 4,893,158 | A | * | 1/1990 | Mihara et al. ............... 257/341 |
| 5,341,003 | A | * | 8/1994 | Obinata ....................... 257/135 |
| 6,815,798 | B2 | * | 11/2004 | Aiello et al. ................. 257/532 |
| 2002/0060340 | A1 | * | 5/2002 | Deboy et al. ................ 257/330 |
| 2005/0024925 | A1 | * | 2/2005 | Deboy et al. ................ 365/154 |

* cited by examiner

*Primary Examiner*—Mark V. Prenty
(74) *Attorney, Agent, or Firm*—Laurence A. Greenberg; Werner H. Stemer; Ralph E. Locher

(57) ABSTRACT

The invention relates to a configuration for generating a low-voltage signal proportional to the high voltage present between the source and the drain of a power transistor. For this purpose, a capacitive voltage divider including the source-gate capacitance serving as a low-voltage tap and the source-drain capacitance serving as a high-voltage element is situated in a voltage sense region.

14 Claims, 3 Drawing Sheets

CONFIGURATION FOR GENERATING A VOLTAGE SENSE SIGNAL IN A POWER SEMICONDUCTOR COMPONENT

BACKGROUND OF THE INVENTION

Field of the Invention

The present invention relates to a configuration for generating a low-voltage signal proportional to a high voltage present between the source and the drain of a power semiconductor component. The invention relates, in particular to a semiconductor body in which the power semiconductor component is formed.

In numerous applications of power semiconductor components, in particular power transistors or else IGBTs (Insulated Gate Bipolar Transistors), the high voltage present between the drain and the source or the collector and the emitter has to be monitored in order to be able to control the exact voltage profile and, if appropriate, to intervene before destruction of the power semiconductor component. For this purpose, a low-voltage signal that is as much as possible proportional to the high voltage present between the drain and the source, a so-called voltage sense signal, has to be obtained. This signal is fed to a unit that controls the high voltage present between the drain and the source, for example, a control IC.

The instant at which the voltage across the power semiconductor component or the semiconductor body or the chip thereof collapses or rises is then detected in the control IC. By way of example, it is thus possible precisely to slow down the profile of the gate voltage rise or fall for EMC (Electromagnetic Compatibility) reasons when a switch realized by the power transistor actually begins to switch. Without a voltage sense signal indicating the profile of the high voltage between the drain and the source, this instant cannot be identified since the so-called "Millerplateau" in the voltage profile, at which the switch actually switches depends on the latter's threshold voltage, load current and temperature. However, if a voltage sense signal proportional to the high voltage present between the drain and the source is generated, then adaptive control of the switching instant of the switch realized by the power transistor is possible.

A further possibility of application for a configuration for generating a low-voltage signal, which is proportional to a high voltage present between the source and the drain of a power transistor, serving as a voltage sense signal may be seen in the detection of the voltage zero crossing of a switch realized by the power transistor. By detecting the voltage zero crossing, it is possible, for example, to realize resonant or quasi-resonant circuit topologies.

Furthermore, using a voltage sense signal as a signal proportional to the high voltage between the drain and the source, an intermediate circuit voltage can also be monitored in order, in the case of switched-mode power supplies, for example, to be able to turn off the entire apparatus in good time before power transistors used therein experience an avalanche breakdown through inductances. This might happen if, in the event of an excessively high intermediate circuit voltage, the main transistor of the switched-mode power supply switches on and the sum of the intermediate circuit voltage and the flyback voltage of the switched-mode power supply with flyback converter exceeds the breakdown voltage of the main transistor.

There is thus a considerable need for a configuration that can be used to generate a low-voltage signal, which is proportional to the high voltage between the drain and the source, and which serves as a voltage sense signal. For such a configuration, an external resistor and/or capacitive voltage divider has been used heretofore for the purpose of voltage detection, which necessitates additional structural parts or components and contributes to a high placement outlay.

SUMMARY OF THE INVENTION

It is accordingly an object of the invention to provide a configuration for generating a low-voltage signal proportional to a high voltage present between the source and the drain of a power semiconductor component, which overcomes the above-mentioned disadvantages of the prior art apparatus of this general type.

In particular, it is an object of the present invention to provide a configuration for generating a low-voltage signal proportional to a high voltage present between the source and the drain of a power semiconductor component, which configuration is constructed in a simple manner and necessitates the least possible outlay.

In the case of a configuration of the type mentioned in the introduction, this object is achieved according to the invention by virtue of the fact that a capacitive voltage divider including the series circuit formed by a source-gate capacitance as a low-voltage tapping element and a source-drain capacitance as a high-voltage element is formed in the semiconductor body in parallel with the source-drain path of the power semiconductor component.

Thus, in the case of the inventive configuration, a capacitive voltage divider composed of the series circuit formed by the source-gate capacitance serving as a low-voltage tapping element and the source-drain capacitance serving as a high-voltage element is realized together with the power semiconductor component, in particular together with a power transistor. Since the source-drain capacitance in power transistors has a nonlinear profile that is monotonically dependent on the voltage between the drain and the source, a monotonic, nonlinear division ratio results for the two capacitances, that is to say, the source-drain capacitance and the source-gate capacitance.

The configuration can readily be employed in low-voltage, high-voltage, lateral and vertical power semiconductor components, in particular power transistors, where these components can be embodied "conventionally" or according to the compensation principle. That is to say, as compensation components with p- and n-conducting regions in the drift path for charge compensation. The application in the case of compensation components is particularly advantageous, however, since, in the latter, the source-drain capacitance and thus the output capacitance assumes a very small, constant value at relatively large source-drain voltages. At source-drain voltages of above 100 V, the voltage sense signal obtained from the source-gate capacitance then practically forms a linear function of the source-drain voltage here.

The magnitude of the voltage sense signal can be set by way of the ratio of the source-gate capacitance to the source-drain capacitance in order thus, for example, advantageously to harmonize with the input voltage strength of a low-voltage control IC, that is to say the control unit for the power transistor. The respective capacitances can readily be adapted by varying the gate area above the source region by way of openings in the gate electrode and/or by varying the thickness of the gate insulating layer.

The read-out of the voltage sense signal in the control IC can be effected, for example, by measuring the voltage drop across a parallel-connected input capacitance or a resistor. If read-out is effected capacitively, then it is possible correspondingly to obtain information about AC and DC signals that are present between the source and the drain of the power semiconductor component. However, a hysteresis curve then occurs between the switch-on and the switch-off. By contrast, if read-out is effected via a resistor, then only information about voltage changes are determined since the voltage sense signal decays to zero with respect to time after voltage changes. This information is sufficient for detecting the switching instant of a switch formed by the power semiconductor component. The information can also be used to eliminate the hysteresis, if appropriate.

The inventive configuration is straightforward to realize since it does not require any additional masks or additional masking steps. Preferably, in the region of the capacitive voltage divider, that is to say in the so-called "sense region", a gate electrode separated from the gate of the actual power semiconductor component, in particular power transistor, is connected via a contact hole in an insulating layer to the source of the power semiconductor component. In the case of an n-conducting semiconductor body, the voltage sense signal is obtained at p-conducting wells. A drain electrode of the capacitive voltage divider is connected to the drain of the power semiconductor component or power transistor.

Other features which are considered as characteristic for the invention are set forth in the appended claims.

Although the invention is illustrated and described herein as embodied in a configuration for generating a voltage sense signal in a power semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
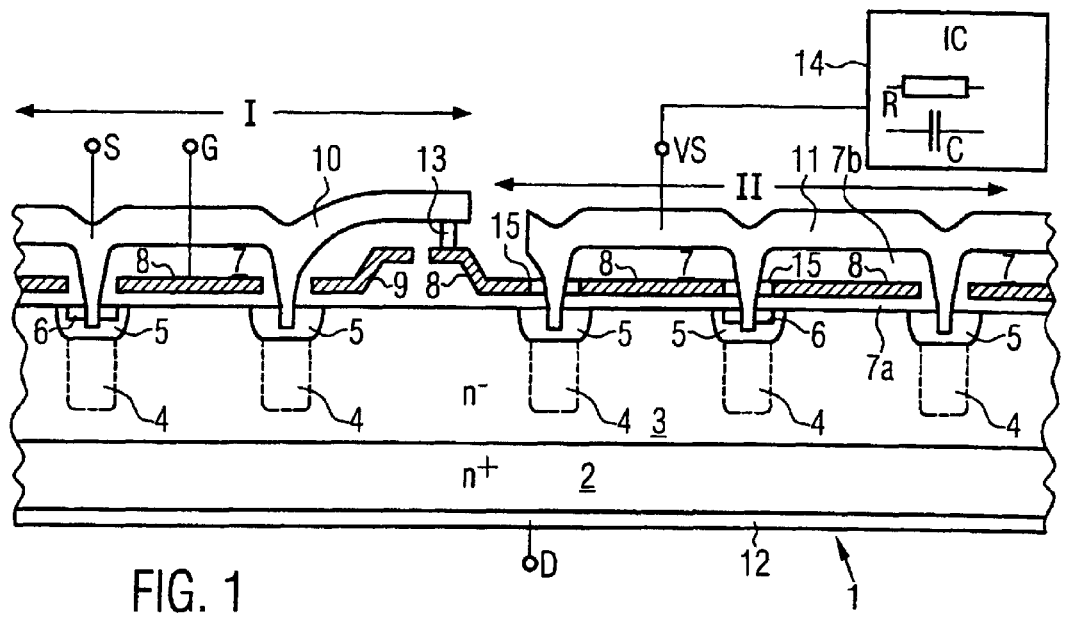
FIG. 1 is a diagrammatic cross sectional illustration of the configuration for generating a low-voltage signal proportional to a high voltage present between the source and the drain of a power semiconductor component.

Referring now to the figures of the drawing in detail and first, particularly, to FIG. 1 thereof, there is shown a semiconductor body 1 including an n$^+$-conducting substrate 2, on which an n$^-$-conducting epitaxial layer 3 is applied. Silicon is preferably used for the semiconductor substrate 1. However, it is also possible to use other materials, such as, for example, SiC et cetera.

There may be p-conducting compensation regions 4 (indicated by broken lines) situated in the n-conducting epitaxial layer 3. The p-conducting compensation regions 4 are arranged alternately with n-doped regions of the layer 3 and provide for charge compensation. In other words, n- and p-conducting regions alternate with one another. The advantages of such a charge compensation, in particular with regard to reducing the on resistance, are known per se. The present invention can be applied in the same way to power semiconductor components with and without compensation regions. The advantages that can be obtained specifically with compensation regions have already been pointed out above, however.

The epitaxial layer 3 has p-conducting wells 5 that are introduced in the region of the surface thereof. An n$^+$-conducting source zone 6 is provided in the wells 5, except for the edge cells. It should be noted that the conduction types specified may also be the exact opposite in each case. In other words, the substrate 2 and the layer 3 may be p-conducting, the wells 5 n-conducting and the source zone 6 p-conducting.

An insulating layer 7 with a gate oxide and an intermediate oxide including, for example, silicon dioxide and/or silicon nitride is provided on the surface of the epitaxial layer 3. Gate electrodes 8 and field plates 9 including preferably highly doped polycrystalline silicon are incorporated into the insulating layer 7.

Finally, there are also provided in FIG. 1 a source metallization 10 in a left-hand transistor region I and a voltage sense metallization 11 in a right-hand region II. Both metallizations 10 and 11 may include aluminum, for example.

A drain metallization 12 likewise including aluminum, for example, is additionally situated on the rear side of the semiconductor substrate 2. In this case, the drain metallization 12 covers both the transistor region I and the voltage sense region II.

The source metallization 10 is connected to the gate electrode 8 in the voltage sense region II via a contact hole in the insulating layer 7. This contact hole is filled with a metal plug 13 made of aluminum, for example. The gate electrodes 8 present in the voltage sense region II may be configured in contiguous fashion. It is also possible to provide the p-conducting wells 5 with source zones 6 in the region II. This need not be the case, however. In other words, the source zones 6 are optionally present here. For this reason, only one source zone 6 is illustrated in the drawing in the voltage sense region II.

In the transistor region I, the source metallization 10 is connected to a source terminal S, while the gate electrode 8 is connected to a gate terminal G. Furthermore, in the voltage sense region II, the voltage sense metallization 11 is connected to a voltage sense terminal VS.

The drain metallization 12 is connected to a drain terminal D.

The voltage sense terminal VS can be connected to a low-voltage control unit 14. This unit 14, together with the configuration described, may be contained in an IC.

Figure 2:
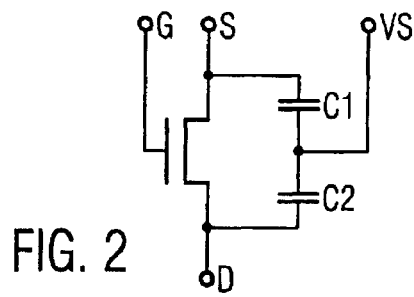
FIG. 2 is an equivalent circuit diagram for the configuration shown in FIG. 1.

FIG. 2 shows an equivalent circuit diagram for the configuration of FIG. 1. The capacitance C1 between the source terminal S and the voltage sense terminal VS is essentially formed by the capacitance of the insulating layer 7 between the gate electrode 8 and the p-type well 5, while the capacitance C2 between the voltage sense terminal VS and the drain is produced by the pn junction between the well 5 and the layer 3.

The gate area in the voltage sense region II can be set by varying the size of openings 15 for the voltage sense metallization 11. It is equally possible to vary the thickness of the gate oxide, that is to say the thickness of the gate oxide of the insulating layer 7 below the gate electrodes 8. These changes make it possible to set the ratio between the source-gate capacitance and the source-drain capacitance in such a way that the voltage sense signal at the voltage sense terminal VS has the desired magnitude in order to harmonize with the input voltage strength of the low-voltage control unit 14.

The read-out of the voltage sense signal in the low-voltage control unit 14 is preferably effected by measuring the voltage drop of the signal at a parallel-connected input capacitance C or a resistor R.

If read-out is effected capacitively, that is to say using the input capacitance C in the control unit 14, then information about DC and AC signals are obtained. A hysteresis curve is present between switch-on and switch-off.

Figure 3:
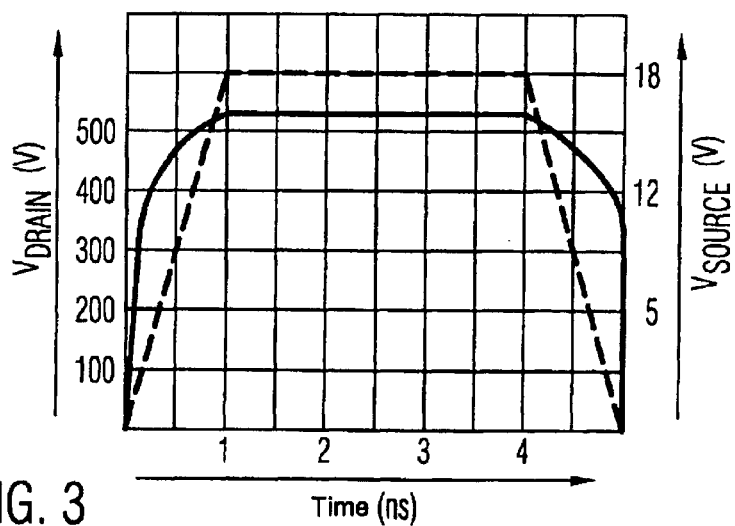
FIGS. 3 to 5 are diagrams for elucidating a switch-on and switch-off operation with a capacitive read-out of the voltage sense signal.
Figure 4:
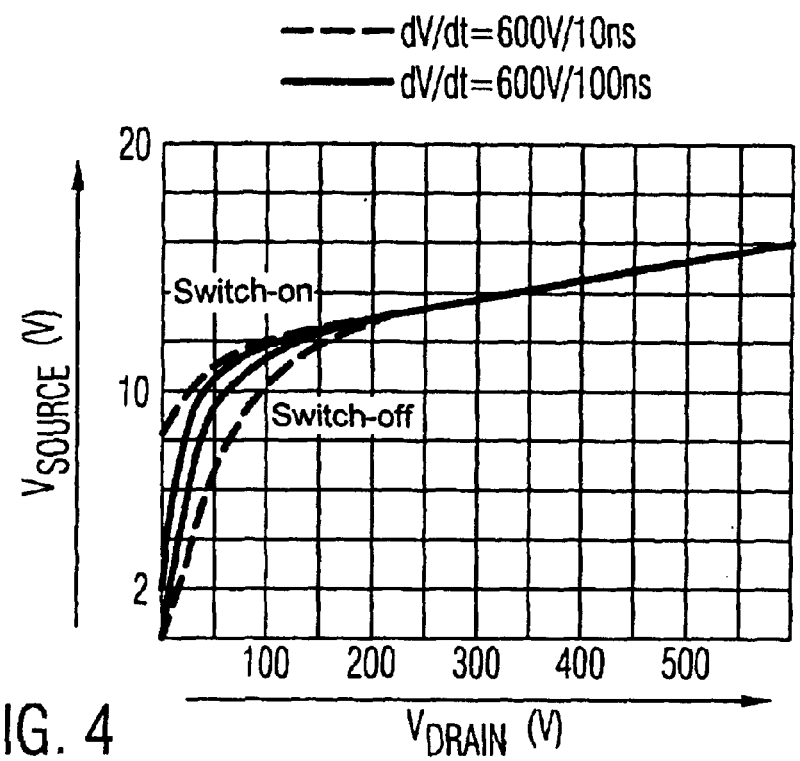
Figure 5:
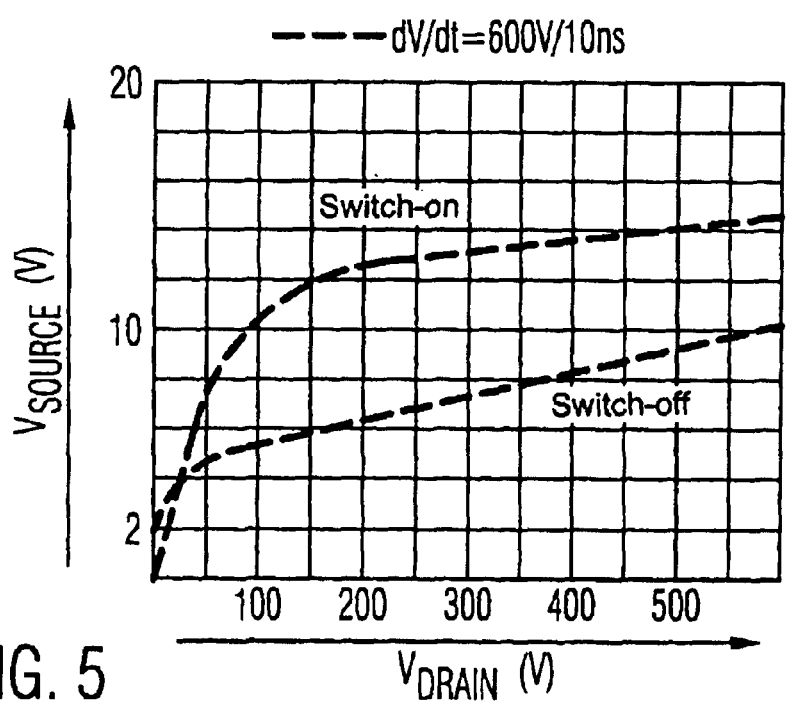

By way of example, FIG. 3 uses a broken line to show the drain voltage $V_{DRAIN}$ present between the source terminal S and the drain terminal D and a solid line to show the voltage sense voltage VS ($V_{SOURCE}$) as a function of time. FIGS. 4 and 5 illustrate the profile of the voltage sense signal $V_{SOURCE}$ as a function of the source-drain voltage $V_{DRAIN}$ for a switch-on operation ("switch-on" two upper curves) and a switch-off operation ("switch-off" two lower curves) of the power transistor in the region I for different rates of voltage rise (FIG. 4: dV/dt=600 V/10 ns in a broken line and dV/dt=600 V/100 ns in a solid line; FIG. 5: dV/dt=600 V/10 ns in broken line). FIG. 4 shows the relationship for a high sense resistance and FIG. 5 shows the relationship for a low sense resistance.

Figure 6:
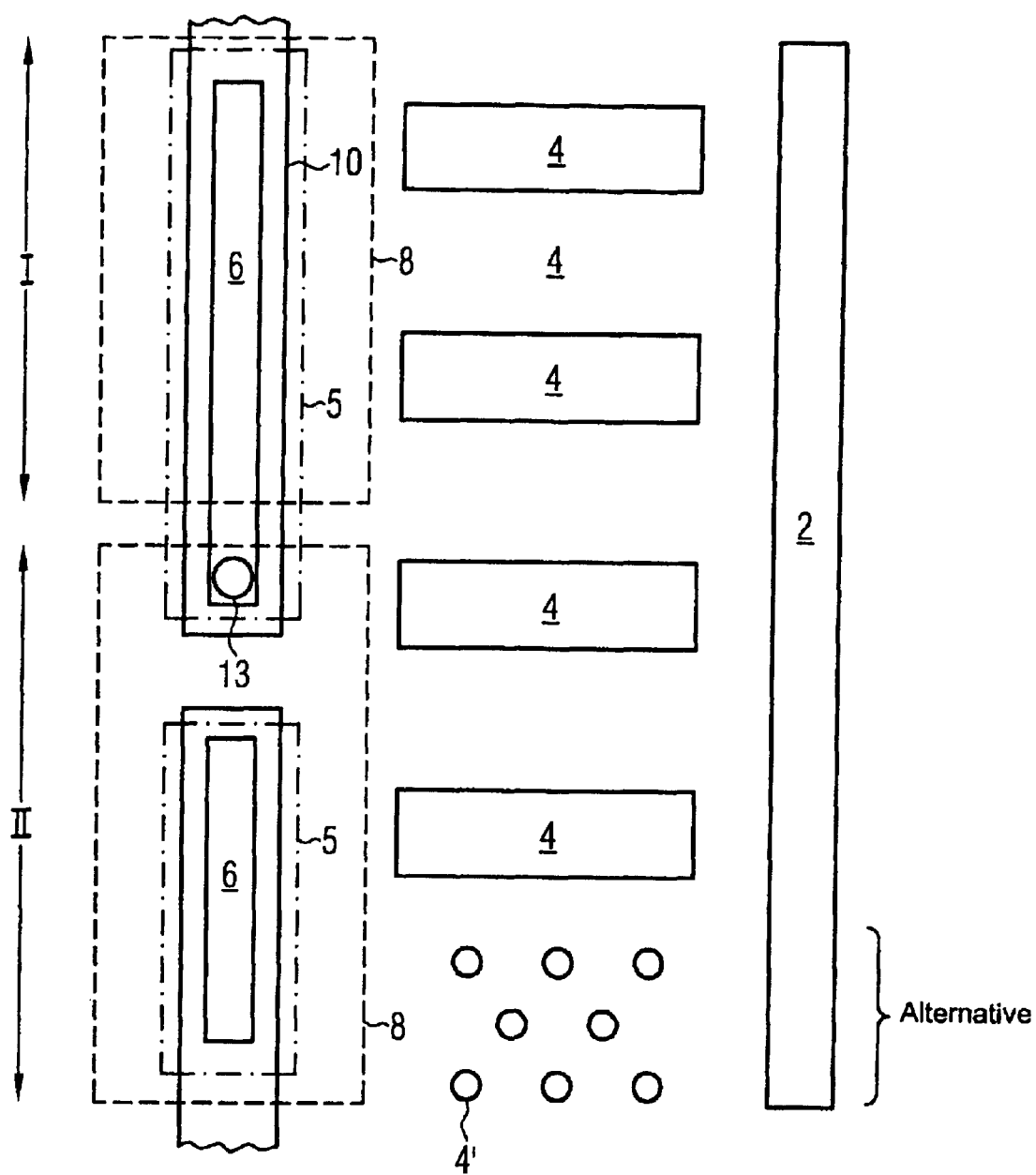
FIG. 6 is a diagrammatic plan view of a lateral structure of the configuration.

FIG. 6 shows a plan view of a lateral structure of the inventive configuration. Here, too, the metal plug 13 is led between the source metallization 10 in the transistor region I and the gate electrode 8 in the voltage sense region II. The compensation regions 4 may be floating as in the case of the vertical structure of FIG. 1 or, alternatively, may be connected to the p-type wells 5 as shown in FIG. 6. Spherical compensation regions 4' may also be present instead of pillar-type compensation regions 4.

We claim:

1. A configuration for generating a low-voltage signal proportional to a high voltage present between a source and a drain of a power semiconductor component, the configuration comprising:
   a semiconductor body including said power semiconductor component;
   said semiconductor body including a capacitive voltage divider having a series circuit formed by a source-gate capacitance serving as a low-voltage tapping element and a source-drain capacitance serving as a high-voltage element;
   said power semiconductor component including a source-drain path connected in parallel with said capacitive voltage divider.

2. The configuration according to claim 1, wherein:
   said power semiconductor component includes a source zone, a gate area configured above said source zone, a source-gate capacitance and a source-drain capacitance; and
   said semiconductor body is formed with a plurality of openings for setting said gate area in order to set a ratio between the source-gate capacitance and the source-drain capacitance.

3. The configuration according to claim 1, in combination with a low-voltage control IC, wherein:
   said power semiconductor component includes a voltage sense metallization providing the low-voltage signal; and
   said voltage sense metallization is connected to said low-voltage control IC.

4. The configuration according to claim 3, wherein:
   said low-voltage control IC includes at least one component selected from a group consisting of an input capacitance and a resistor; and
   said component obtains the low-voltage signal.

5. The configuration according to claim 1, wherein:
   said semiconductor body includes a voltage sense region with a voltage sense metallization;
   said semiconductor body includes a transistor region with a source metallization; and
   said semiconductor body includes a contact plug connecting said voltage sense metallization to said source metallization.

6. The configuration according to claim 1, wherein said power semiconductor component is a compensation component.

7. The configuration according to claim 6, wherein said semiconductor body includes a plurality of floating compensation regions.

8. The configuration according to claim 7, wherein said plurality of floating compensation regions are in a pillar form or a spherical form.

9. The configuration according to claim 8, wherein:
   said semiconductor body includes a plurality of compensation regions having a conduction type;
   said semiconductor body includes a plurality of wells having the conduction type of said plurality of compensation regions; and
   said plurality of compensation regions are connected to said plurality of compensation regions.

10. The configuration according to claim 7, wherein said plurality of floating compensation regions are in a pillar form or a spherical form.

11. The configuration according to claim 1, wherein said power semiconductor component is a vertical component or a lateral component.

12. The configuration according to claim 1, wherein said capacitive voltage divider has a dedicated tap or terminal.

13. The configuration according to claim 1, wherein:
   said power semiconductor component includes a source zone, a gate area configured above said source zone, a source-gate capacitance and a source-drain capacitance; and
   said semiconductor body is formed with a gate insulating layer for setting a ratio between the source-gate capacitance and the source-drain capacitance.

14. The configuration according to claim 1, wherein said power semiconductor component is a power transistor.

* * * * *